United States Patent [19]

Sano et al.

[11] Patent Number: 5,755,887
[45] Date of Patent: May 26, 1998

[54] COMPONENTS OF APPARATUS FOR FILM MAKING AND METHOD FOR MANUFACTURING THE SAME

[75] Inventors: Nobuyuki Sano; Tsutomu Hasegawa, both of Hiratsuka; Kano Kosaki; Hidenori Suwa, both of Zushi, all of Japan

[73] Assignee: Nihon Sinku Gijutsu Kabusiki, Japan

[21] Appl. No.: 780,734

[22] Filed: Jan. 8, 1997

Related U.S. Application Data

[62] Division of Ser. No. 626,421, Apr. 2, 1996, Pat. No. 5,628,839.

[30] Foreign Application Priority Data

Apr. 6, 1995 [JP] Japan ................... 7-108165

[51] Int. Cl.$^6$ ................... C25C 14/50; C20C 14/56
[52] U.S. Cl. ................... 118/715; 428/470; 428/472.1; 428/472.2
[58] Field of Search ................... 118/715; 148/264, 148/252, 253; 428/470, 472.1, 472.2

[56] References Cited

FOREIGN PATENT DOCUMENTS

| | | |
|---|---|---|
| 87356 | 4/1991 | Japan . |
| 87357 | 4/1991 | Japan . |
| 166361 | 7/1991 | Japan . |
| 166362 | 7/1991 | Japan . |

*Primary Examiner*—Sam Silverberg
*Attorney, Agent, or Firm*—Rudnick & Wolfe

[57] ABSTRACT

Components of apparatus for film making and method for manufacturing the same include components made from aluminum alloy or aluminum without or with uneven surface of unenenness size of up to several mm, which are immersed in any one of sulfuric acid, phosphoric acid, oxalic acid, and chromic acid, and then washed and dried. Such components prevent the deposit of film forming materials on the components form peeling off during film making operation.

10 Claims, 4 Drawing Sheets

COMPONENTS OF APPARATUS FOR FILM MAKING AND METHOD FOR MANUFACTURING THE SAME

This application is a division of application Ser. No. 08/626,421 filed Apr. 2, 1996 which application is now U.S. Pat. No. 5,628,839.

BACKGROUND OF THE INVENTION

1. Field of the Invention

This invention relates to components of apparatus for film making by a vapor deposition method such, as a sputtering, chemical vapor deposition, or vacuum deposition and method for manufacturing the same.

2. Description of the Prior Art

LSI (Large Scale Integrated Circuit), LCD (Liquid Crystal Display), Magneto-optical Disk, Hard Disk and the like are manufactured by a thin film making technique of materials suited for aimed object on substrate. In film making operation, so called "fine particles" that have, for example, several micron meters in diameter, occasionally attach on the substrate, causing problems, for example, short circuit of wiring on the substrate in case of LSI, resulting in low yield of products and losing product reliability in the market.

To this kind of problems, many necessary measures have been taken. In film making process by sputtering, for example, the problems of fine particles carried over by transfer system, or generated from target materials, have almost been solved. At present, it is considered that the existing fine particles are caused by deposits of film-forming material on components of film making apparatus, in other words, peeling and falling off of deposits and by scatter fine particles during film making operation.

Such components of apparatus are a shutter, a shielding plate, a substrate holder, a mask, and so on. But frequent cleaning of film making apparatus before deposits peeling-off and fine particles scattering leads to decrease of operation time.

Some kinds of techniques to dissolve the above problems have been disclosed at Japanese Patent opening Gazette No. 87356/1991, No. 87357/1991, No. 166361/1991 and No. 166362/1991. In those, the surface of the components of film making apparatus are covered by metal foil embossed, or metal foil corrugated. Electrolytic refined copper foils embossed are: already on the market, and they are fixed by spot welding or riveting, covering the surface of the components. And it is disclosed that the copper foil embossed is effective to keep deposit of film forming materials on itself, because the copper foil relaxes peeling stress between the copper foil and the deposit by means of deforming itself before peeling-off occurs. Electrolytic refined copper foil embossed is disclosed to be effective to prevent the deposit from peeling off, but it cannot be used over again, and it is troublesome to detach the used one and fix the new one at every intervals of operation. Furthermore, exceeding thickness of deposit causes the copper foil to tear, exposing surface of components.

Another technique is shot-blasting or glass-beads blasting to surface of components to clean the surface and increase the total area of surface, increasing adhesion strength of deposit, but its effect is not enough to prevent the deposits from peeling off. And due to repeated blasting, heat is accumulated in the components, occasionally resulting in cracking of the components. Differently another technique is coating by thermal spray (molten metal spray) on shot blasted base metal. For example, coating by thermal spray of aluminum, which is easy to be deformed, on shot-blasted surface of aluminum alloy base plate as shown in FIG. 1 is widely used. This technique is rational in the point that peeling stress of the deposit of film-forming material is relaxed by means of deformation of the coating itself. But, about 0.5 mm in thickness of deposit of film forming material like Tantalum which has large degree of peeling stress, leads to peeling between the coating by thermal spray of aluminum and the aluminum alloy base plate. As mentioned above, there is no effective technique to prevent deposit from peeling off. Furthermore, as described below, components coated by thermal spray has the defect that gases occluded in the coating causes outgassing from the components during film making operation.

SUMMARY OF THE INVENTION

Accordingly, it is an object of this invention to provide components of apparatus for film making that prevent the deposits of film forming materials from peeling off.

Another object is to provide a method to manufacture components of apparatus for film making that prevent the deposit of film forming materials from peeling off.

In accordance with an aspect of this invention, components of apparatus for film making comprising:

(A) base metal made from aluminum alloy or aluminum, (B) uneven surface, having unevenness size of up to several mm, or even surface of said base metal, and washed, and (C) surface treated by immersing in any one of sulfuric acid, phosphoric acid, oxalic acid, and chromic acid such components prevent deposit of film forming materials on the components from peeling off during film forming operation.

And a method for manufacturing components of apparatus for film making comprising the steps of:

(A) forming uneven surface, having unevenness size of up to several mm, on base metal made from aluminum alloy or aluminum, or not forming;

(B) immersing said base metal in any one of sulfuric acid, phosphoric acid, oxalic acid, and chromic acid to treat the surface of said base metal, and washing and drying.

The foregoing and other objects, features, and advantages of the present invention will be more readily understood upon consideration of the following detailed description of the preferred embodiment of the invention, taken in conjunction with the accompanying drawings.

DESCRIPTION OF THE PREFERRED EMBODIMENTS

Next, components of apparatus for film making and method for manufacturing the same according to this invention, will be described with reference to the drawings.

EMBODIMENT 1

Figure 2:
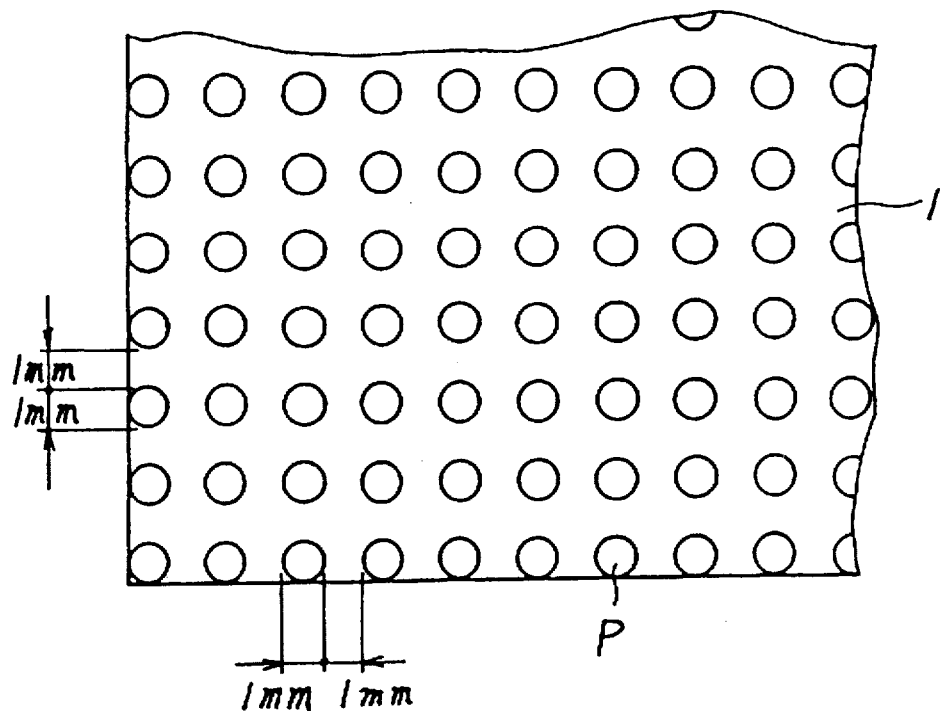
FIG. 2 shows a part of aluminum alloy plate as base metal (1) which has uneven surface previously formed, according to Embodiment 1 of this invention. A is a partial top view and B is a partial side view of it.
Figure 2:
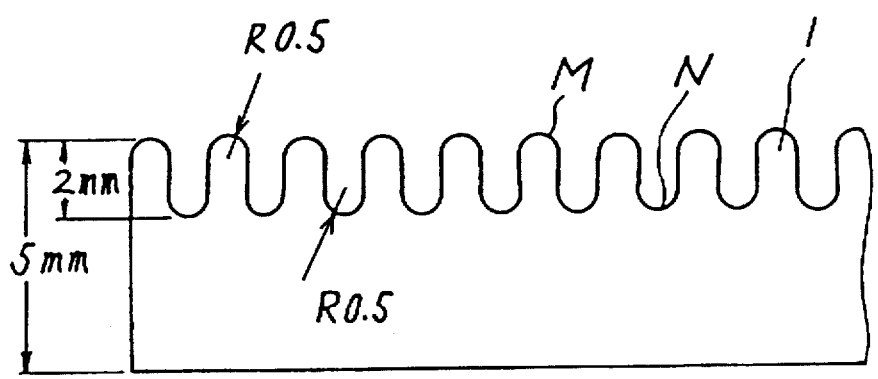

One surface of the plate (150 mm×200 mm×5 mm) of aluminum alloy (JIS, H4000, A5052P) was machined by end mill to form uneven surface in a form as shown in FIG. 2 as base metal (1). FIG. 2A is a partial top view and FIG. 2B is a partial side view of it. Namely, in both longitudinal and transverse directions at right angles, grooves having width of 1 mm, were formed at pitches of 2 mm. The formed peeks M and bottoms N were rounded by R=0.5 mm, and the depth between the peek M and bottom N was equal to 2 mm. Such an uneven surface of the plate was shot-blasted, and then immersed in sulfuric acid of concentration 17% for 24 hours at ambient room temperature. Then, it was picked out and washed by water and dried. Surface roughness Ra (defined in JIS, B0601) of the plate was equal to about 15 μm. Hereafter, the treated plate in such a manner as above described is called as "Treated plate A".

In apparatus for film making by sputtering method, film-forming materials which is sputtered from a target, deposit not only on substrate, but also on surrounding or neighbour components which are not required to be film-formed. Ordinary, a shielding plate is installed around the target against deposition of film forming material on surrounding components except for the shielding plate itself.

In apparatus for tantalum (Ta) film-making by sputtering method on glass plate substrate, the above mentioned "Treated plate A" was installed around the tantalum target as the shielding plate in a manner to face its machined uneven surface to the tantalum target. In proportion as batch operations of sputtering were repeated, the thickness of tantalum deposit on the shielding plate increased and became equal to 5 to 6 mm, but the deposit of tantalum did not peel off. It is supposed that the machined uneven surface of the Treated plate A dispersed stress which originates peeling, and furthermore the treated layer on aluminum alloy plate surface by sulfuric acid, for example, something like passive state layer, relaxed or reduced the above described.

COMPARISON EXAMPLE

Figure 1:
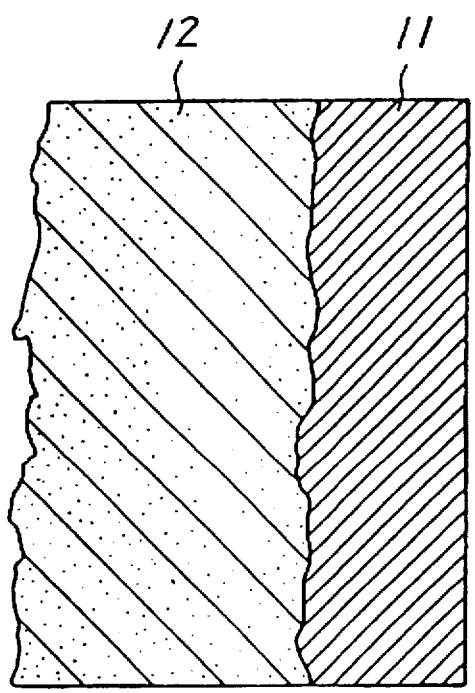
FIG. 1 is a part of cross sectional view of shielding plate of a prior art, which is compared in FIG. 4 as specimen of prior art.

One surface of the same plate of aluminum alloy as used in Embodiment 1 was just shot-blasted and coated by thermal spray with aluminum layer of 0.3 to 0.4 mm in thickness as shown in FIG. 1. FIG. 1 is a partial cross-sectional view magnified by about 100 times (100 magnifications). This is called as "Comparison plate", hereafter.

Comparison plate was installed as shielding plate in a manner to face its thermal sprayed surface to tantalum target in the apparatus for tantalum film making used in embodiment 1. When thickness of deposit of tantalum became equal to about 0.5 mm, some peeling-off occurred between the plate of aluminum alloy and the thermal sprayed layer.

Figure 4:
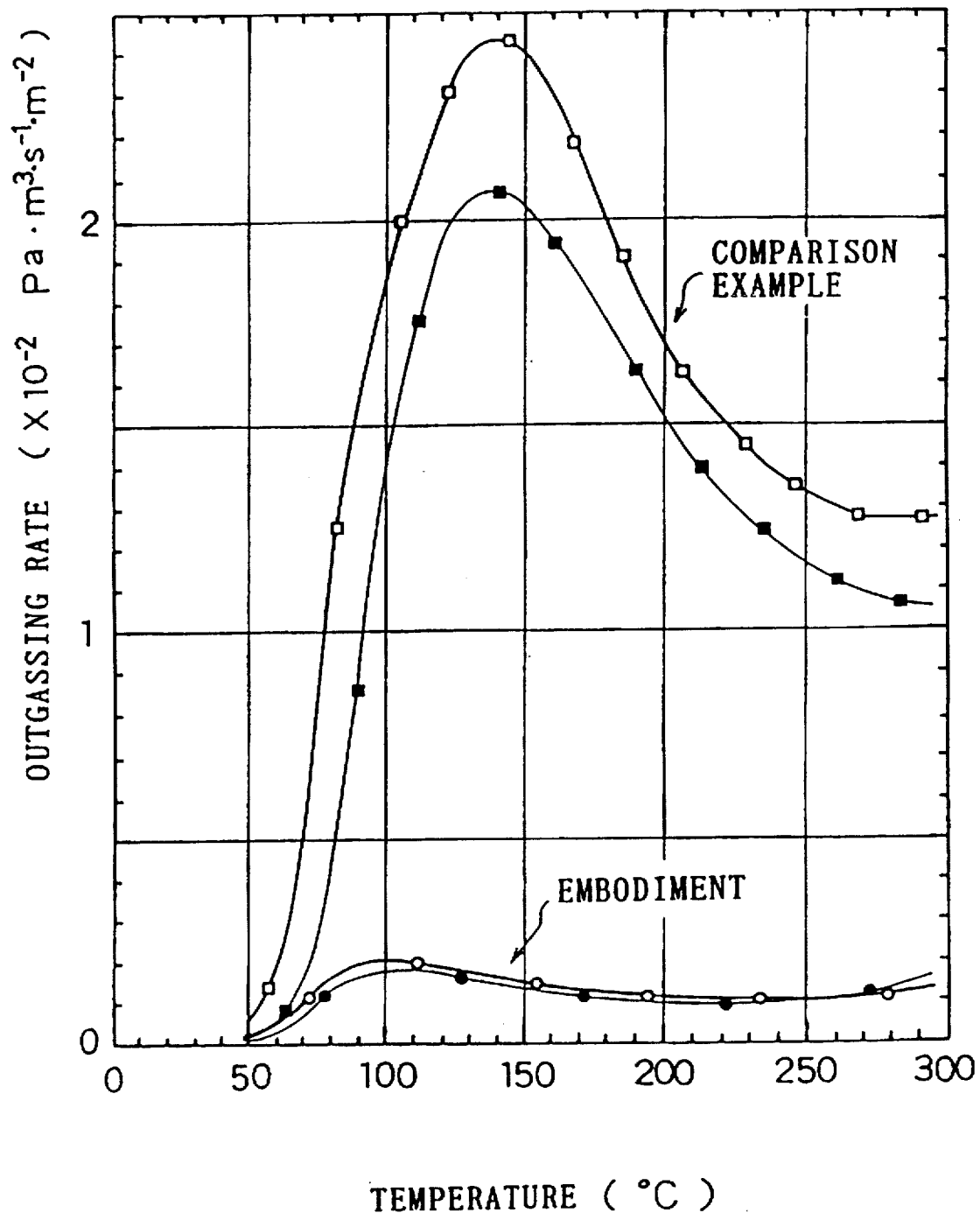
FIG. 4 represents data of outgassing rate of shielding plate of Embodiment 1 of this invention, and of comparison plate as a prior art.

Further, rates of out-gassing were experimentally measured on both "Treated plate A" and "Comparison plate" respectively twice. Results are shown in FIG. 4, and they show that rate of out-gassing of "Treated plate A" is approximately equal to 1/10 to 1/20 of that of "Comparison plate". This fact means that "Treated plate A" is superior to "Comparison plate" in using as component of apparatus for film making, and suggests that "Treated plate A" might have something like gas barrier on its surface.

EMBODIMENT 2

The same "Treated plate A" as in Embodiment 1 was prepared and installed as a shutter in apparatus for film forming, and molybdenum (Mo) was sputtered on glass plate substrate. In proportion as batch operations of sputtering were repeated, the thickness of deposit of molybdenum on the shutter was increased into 5 to 6 mm. But the deposit of molybdenum adhered tightly to the shutter, and did not show any sigh of peeling off.

EMBODIMENT 3

Figure 3:
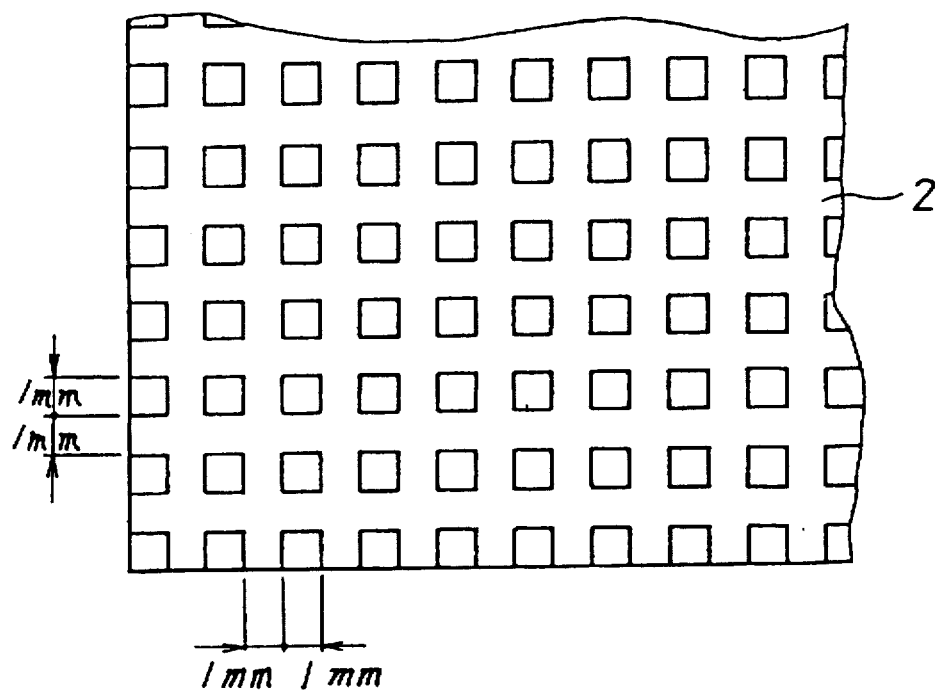
FIG. 3 shows a part of aluminum alloy plate as base metal (2) which has uneven surface previously formed, according to Embodiment 2 of this invention. A is a partial top view and B is a partial side view of it.
Figure 3:
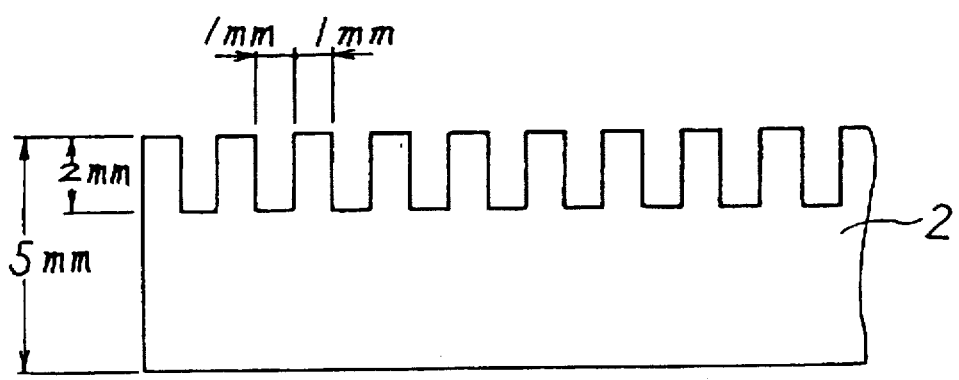

One surface of plate (150 mm×200 mm×5 mm) of aluminum alloy was machined by end mill to form uneven surface in a form as shown in FIG. 3 as base metal (2). FIG. 3A is a partial top view and FIG. 3B is a partial side view of it. Namely, in both longitudinal and transverse (lateral) directions at right angles, grooves having width of 1 mm, depth of 2 mm were made at pitches of 2 mm with edges and corners. Such uneven surface of the plate were shot-blasted, and then immersed in sulfuric acid of concentration 17% for 24 hours at ambient room temperature. Then, it was picked out and washed by water, and dried. Hereafter, the treated plate in such a manner as above described is called as "Treated plate B".

In an apparatus for ITO (Indium Tin Oxide) film making by sputtering method to get transparent electrode on glass plate substrate, the above described "Treated plate B" was installed around an ITO target as a shielding plate, in a manner to face its machined uneven surface to the target, and ITO was sputtered. After batch operations of sputtering were repeated, thickness of ITO deposit on the shielding plate became 5 equal to 6 mm, but it did not show any sign of peeling off. "Treated plate B" could stand against peeling off of ITO deposit in spite of its edges and corners, probably because ITO has substantially small peeling stress in comparison to tantalum and molybdenum. Thus, the shape of uneven surface of base metal can be changed according to magnitude of peeling stress which film forming materials has originally.

EMBODIMENT 4

The "Treated plate A" and "Treated plate A" which were much the same with "Treated plate A" in Embodiment 1, but different only in shape, were prepared. "Treated plate A" was prepared in the following way. The longer sides of base metal (1) of FIG. 2 in embodiment 1 was bended into curvature with a radius of 150 mm in a manner to face the uneven surface to the outside, and then shot-blasted and immersed in sulfuric acid in the same manner as in embodiment 1. "Treated plate A" was similarly prepared, but bended in a manner to face the uneven surface to the inside, also before shot-blasting and immersing in sulfuric acid, and then shot -blasted and immersed in sulfuric acid.

"Treated plate A", "Treated plate A" and "Treated plate A" were placed on trial as a part of inside wall of an apparatus for film making by CVD method. Thus, in an apparatus for silicon dioxide (SiO$_2$) film making on silicon (Si) substrate by chemical reaction of monosilane (SiH$_4$) gas with oxygen (O$_2$) gas, deposit of silicon dioxide adhered tightly to all of "Treated plate A", "Treated plate A" and "Treated plate A" and showed no evidence of peeling off, making clear that they can be used as an inside wall of apparatus for film making.

EMBODIMENT 5

The same "Treated plate A" as used in Embodiment 1 was installed in an apparatus for aluminum (Al) film forming by vacuum deposition method onto unrolled polypropylene (PP) film as shielding plate around the crucible which was filled with :molten aluminum. This shielding plate prevented deposit of aluminum on the shielding plate from falling off into the crucible.

In the prior art, the deposit occasionally fell off into the crucible, causing molten aluminum to splash.

EMBODIMENT 6

Aluminum alloy plates, as base metal (1) of FIG. 2 in embodiment 1, were prepared and shot -blasted to uneven surface. They were immersed in phosphoric acid of concentration 20%, oxalic acid of concentration 5%, and chromic acid of concentration 3% respectively at ambient room temperature, and after that, they were picked out, washed by water, and then dried.

Though immersing time longer than one week was required for each of them, three kinds of treated plates installed as shielding plate in an apparatus used in Embodiment 1, were recognized that they had the same effect to keep deposit of tantalum from peeling off during film making operation as "Treated plate A" in Embodiment 1.

While the preferred embodiments have been described, variations thereto will occur to those skilled in the art within the scope of the present inventive concepts which are delineated by the following claims.

For example, in order to get base metal at all of the embodiments above mentioned, aluminium alloy plate (JIS, H4000, A5052P) is used, but this plate can be exchanged for other kind of aluminium alloy plate or aluminum plate. Still more, aluminium alloy clad steel plate, or aluminum clad steel plate can be used in place of aluminium alloy plate.

Further, uneven surface derived from grooves at all of the embodiments above mentioned plays role to disperse peeling stress of deposit on the surface therefore shape and size of uneven surface are determined in accordance with magnitude of peeling stress which film forming material has originally, and thus cannot be generally defined. Also, as peeling stress is proportional to thickness of deposit, components of apparatus for film making on which film forming material of low peeling stress deposits thinly, can be made from even surface aluminium alloy plate.

Further, uneven surfaces were formed by end mill machining at all of the embodiments above mentioned. Instead of it, electric discharge machining, or squeeze casting, namely liquid forging can be used.

Further, at all of the embodiments above mentioned, uneven surfaces of components were shot -blasted before immersing in acid. Shot-blasting is intended to clean the surface and increase the total surface area, and adhesion of deposit to component is enhanced by the increased surface area. Depending on the kind of film forming material or thickness of deposit, shot-blasting can be replace by glass-beads blasting. Still more, any blasting can be eliminated, as the occasion demands, or under certain circumstance.

Further, at most of the embodiments above mentioned, sulfuric acid of concentration 17% was used for immersing of base metal after shot -blasting. However, diluted sulfuric acid of any concentration can be used except for concentrated (higher than 90%) sulfuric acid. Concentration of sulfuric acid is determined based on immersing temperature and immersing time. Preferable concentration of sulfuric acid is within the range from 15% to 25%. At concentration over 25%, there is the disadvantage that aluminum alloy or aluminum might be attacked, and at concentration under 15%, it takes too long time to treat base metal productively.

Further, aluminum alloy plate was immersed in sulfuric acid, phosphoric acid, oxalic acid, or chromic acid at the embodiments above mentioned. If immersing makes something like passive state layer on the surface of aluminum alloy plate, it is expected that, in order to enhance the oxidizing power of these acids, addition of oxidizing agent for example potassium permanganate into these acids is effective.

Further, at all of the embodiments above mentioned, shielding plate, shutter, and inside wall of apparatus were installed in apparatus as components of this invention. However, others than the above, also can be installed as components according to this invention. They are, for example, substrate holder, mask, earth shield, shower plate, chimney, and so on.

Further, at all of the embodiments above mentioned, only one surface of aluminum alloy plates was machined to form uneven surface as base metal and shot-blasted to that surface, and thereafter immersed in acid. But, as occasion demands, both surfaces can be machined, shot blasted, and immersed in acid.

Further, at the embodiments above, components were used for apparatus for film making by sputtering method, CVD method, or vacuum deposition method. However, components of this invention can be used also effectively in apparatus for film making by all of vapor phase deposition methods.

Further, at the embodiments above, tantalum and molybdenum that has large peeling stress, ITO that has smaller peeling stress than tantalum and molybdenum, and aluminum that is the same with base metal, were described as film forming materials. However, components of this invention are also effective on all of other film forming materials. For example, binary compositions of tungsten (W) - titanium (Ti), tungsten (W) - silicon (Si), and molybdenum (Mo) - silicon (Si).

What is claimed is:

1. Components of apparatus for film making comprising:
   (A) base metal made from aluminum alloy or aluminum,
   (B) having a uneven surface, having grooves of a size of up to several mm, and
   (C) said surface was treated by immersing in any one of sulfuric acid, phosphoric acid, oxalic acid, and chromic acid and than washing and drying thereby producing a surface such that the deposits on the surface made during the film making do not peel do not peel during film making.

2. Components of apparatus for film making according to claim 1, in which uneven surface is formed in grooves in both longitudinal and transverse directions at right angles, having width of 1 mm, depth of 2 mm, at pitches of 2 mm.

3. Components of apparatus for film making according to claim 2, in which said grooves have rounded edges and corners.

4. Components of apparatus for film making according to claim 2, in which said grooves are formed by an: end mill machining method, a squeeze casting (liquid forging) method , or an electric discharge machining method.

5. Components of apparatus for film making according to claim 1, in which said uneven surface or even surface is shot-blasted or glass-beads -blasted before surface treatment.

6. Components of apparatus for film making according to claim 1, in which said treated surface is immersed in sulfuric acid, concentration of which is within the range of 15% to 25%.

7. Components of apparatus for film making according to claim 1, in which said treated surface is immersed in sulfuric acid, concentration of which is equal to 17%.

8. Components of apparatus for film making according to claim 1, in which said treated surface is immersed in any one of phosphoric acid 20%, oxalic acid 5%, and chromic acid 3%, respectively.

9. Components of apparatus for film making according to claim 1, which is used for any one of a sputtering method, CVD (Chemical Vapor Deposition) method, or a vacuum deposition method.

10. Components of apparatus for film making according to claim 1, which apparatus is used for film forming materials containing tantalum or molybdenum.

* * * * *

UNITED STATES PATENT AND TRADEMARK OFFICE
CERTIFICATE OF CORRECTION

PATENT NO. : 5,755,887

DATED : May 26, 1998

INVENTOR(S) : Nobuyuki Sano, Tsutomu Hasegawa, Kano Kosaki and Hidenori Suwa

It is certified that error appears in the above-identified patent and that said Letters Patent is hereby corrected as shown below: Title page, item:

[75] Inventors "Nobuyuki Sano" should be --Nobuyuki Saso--

Col. 1, line 12: delete "." after "such"

Col. 1, line 44: delete ":" after "are"

Col. 3, line 16: change "irom" to "from"

Col. 4, line 28: change "Treated plate A" after "and" to "Treated plate A" "

Col. 4, line 40 change "Treated plate A" to "Treated plate A" "

Col 4, line 36: change "Treated plate A" to "Treated plate A" "

Col. 4, line 47: change "Treated plate A" to "Treated plate A" "

Col. 4, line 56: delete ":" after "with"

Col. 6, line 25: change "a" before "uneven", to "an"

Claim 4, line 2, "formed by an: end" should be --formed by an end--

UNITED STATES PATENT AND TRADEMARK OFFICE
CERTIFICATE OF CORRECTION

PATENT NO. : 5,755,887

DATED : May 26, 1998

INVENTOR(S) : Nobuyuki Sano, Tsutomu Hasegawa, Kano Kosaki and Hidenori Suwa

It is certified that error appears in the above-identified patent and that said Letters Patent is hereby corrected as shown below:

Claim 4, line 2, "formed by an: end" should be --formed by an end--

Signed and Sealed this

Ninth Day of March, 1999

Attest:

Attesting Officer

Q. TODD DICKINSON

Acting Commissioner of Patents and Trademarks